(12) United States Patent
Watanabe et al.

(10) Patent No.: US 6,348,095 B1
(45) Date of Patent: Feb. 19, 2002

(54) METHOD AND APPARATUS FOR PULLING A SINGLE CRYSTAL

(75) Inventors: Hideki Watanabe, Sanda; Hiroshi Morita, Amagasaki, both of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/570,914

(22) Filed: May 15, 2000

(30) Foreign Application Priority Data

May 13, 1999 (JP) ............................................. 11-132846

(51) Int. Cl.$^7$ .............................................. C30B 15/20

(52) U.S. Cl. ......................... 117/13; 117/202; 117/217; 117/218

(58) Field of Search ............................ 117/13, 15, 202, 117/217, 218, 900

(56) References Cited

U.S. PATENT DOCUMENTS 5,976,245 A * 11/1999 Aydelott ...................... 117/19
6,171,393 B1 * 1/2001 Kurosaka et al. ............. 117/35

FOREIGN PATENT DOCUMENTS

JP         2000327477 A  * 11/2000

* cited by examiner

*Primary Examiner*—Felisa Hiteshew
(74) *Attorney, Agent, or Firm*—Wenderoth, Lind & Ponack, L.L.P.

(57) ABSTRACT

The present invention was achieved in order to provide a method for pulling a single crystal, wherein a single crystal hanging portion makes it possible to pull even a heavy single crystal safely, a new cost related to a seed crystal is not caused by the use of a general and usual seed crystal, the time required for the process can be shortened by making the single crystal hanging portion dislocation-free at a high speed, and even a seed crystal containing a few dislocations can be made dislocation-free, so that a seed crystal to which a few dislocations were induced can be reused without replacement, and an apparatus for pulling a single crystal. The method for pulling a single crystal wherein a single crystal is grown by pulling a seed crystal after dipping the seed crystal into a melt within a crucible, comprises bringing the seed crystal into contact with the melt, further dipping the seed crystal into the melt while the vicinity of the interface between the seed crystal and the melt is heated using an auxiliary heating means, stopping the heating with the auxiliary heating means, and pulling a single crystal without forming a neck.

6 Claims, 7 Drawing Sheets

Fig. 2 (a) PRIOR ART
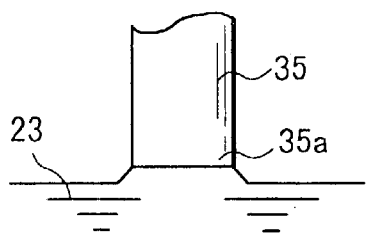
Fig. 2 (b) PRIOR ART
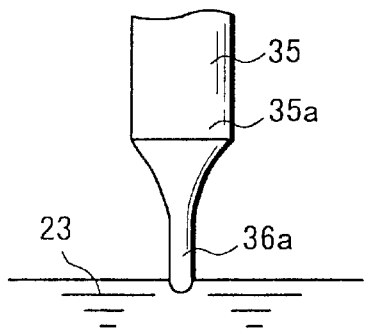
Fig. 2 (c) PRIOR ART
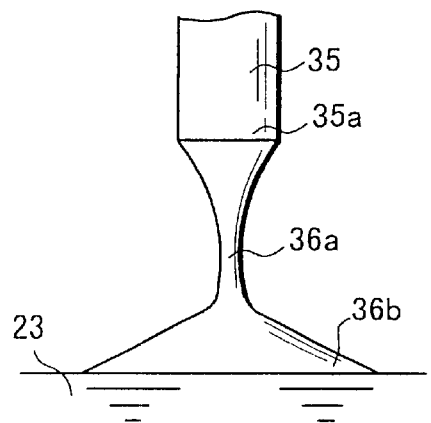
Fig. 2 (d) PRIOR ART
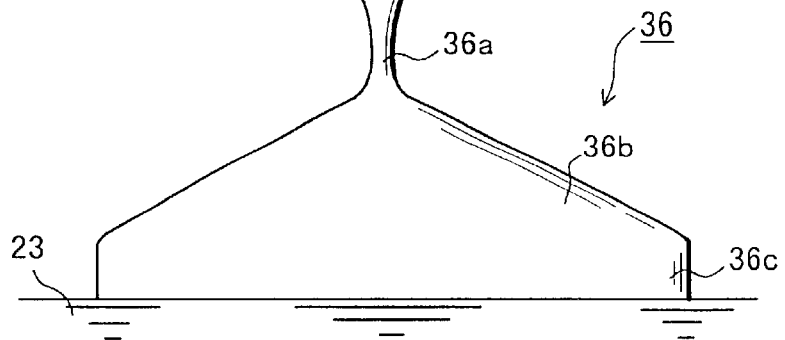

METHOD AND APPARATUS FOR PULLING A SINGLE CRYSTAL

BACKGROUND OF THE INVENTION

1. Field of the Invention

The present invention relates to a method and an apparatus for pulling a single crystal and, more particularly, to a method for pulling a single crystal wherein a single crystal of silicon or the like is pulled by a pulling method such as the Czochralski method (hereinafter, referred to as the CZ method) and an apparatus for pulling a single crystal used for the method for pulling a single crystal.

2. Description of the Relevant Art

At present, the majority of silicon single crystals used for manufacturing a substrate for forming a circuit component of a LSI (large scale integrated circuit) and the like have been pulled by the CZ method. FIG. 1 is a schematic sectional view of a conventional apparatus for pulling a single crystal used for the CZ method, and in the figure, reference numeral 21 represents a crucible.

The crucible 21 comprises a bottomed cylindrical quartz crucible 21a and a bottomed cylindrical graphite crucible 21b fitted on the outer side of the quartz crucible 21a. The crucible 21 is supported with a support shaft 28 which rotates in the direction shown by the arrow A in the figure at a prescribed speed. A heater 22 of a resistance heating type and a heat insulating mold 27 arranged around the heater 22 are concentrically arranged around the crucible 21. The crucible 21 is charged with a melt 23 of a material for forming a crystal which is melted by the heater 22. On the central axis of the crucible 21, a pulling axis 24 made of a pulling rod or wire is suspended, and at the front thereof, a seed crystal 35 is held by a holder 24a. These parts are arranged within a water cooled type chamber 29 wherein pressure can be controlled.

A method for pulling a single crystal 36 using the above-mentioned apparatus for pulling a single crystal is described below by reference to FIGS. 1 and 2. FIGS. 2(a)–2(d) are partial enlarged front views schematically showing a seed crystal and the vicinity thereof in part of the steps in pulling a single crystal.

Although it is not shown in FIG. 2, after reducing the pressure in the chamber 29, an inert gas is introduced into the chamber 29 so as to make an inert gas atmosphere under reduced pressure within the chamber 29. Then, the material for forming a crystal is melted by the heater 22 and is maintained in the situation for a period of time so as to sufficiently release gas contained in the melt 23.

While the pulling axis 24 is rotated on the same axis in the reverse direction of the support shaft 28 at a prescribed speed, the seed crystal 35 held by the holder 24a is caused to descend and is brought into contact with the melt 23 so as to make the front portion of the seed crystal 35 adhere smoothly to the melt 23. Then, the pulling of the single crystal 36 from the melt 23 is started (the seeding step) (FIG. 2(a)).

In making a crystal grow at the front portion of the seed crystal 35, the pulling axis 24 is pulled at a higher speed than the below-described formation speed of a main body 36c. The crystal is narrowed to have a prescribed diameter, leading to the formation of a neck 36a (the neck formation step) (FIG. 2(b)).

By slowing down the pulling speed of the pulling axis 24 (hereinafter, simply referred to as the pulling speed), the neck 36a is made to grow to have a prescribed diameter, leading to the formation of a shoulder 36b (the shoulder formation step) (FIG. 2(c)).

By lifting the pulling axis 24 at a fixed rate, the main body 36c having a uniform diameter and a prescribed length is formed (the main body formation step) (FIG. 2(d)).

Although it is not shown in FIG. 2, in order to prevent induction of high-density dislocations to the single crystal 36 by a sudden change in temperature at the end, the diameter of the single crystal 36 is gradually decreased so that the temperature of the whole single crystal 36 is gradually lowered, leading to the formation of an end-cone. Then, the single crystal 36 is separated from the melt 23. After finishing the above steps, cooling the single crystal 36 is the end of the pulling process of the single crystal 36.

One of the important steps in the pulling of the single crystal 36 is the above-mentioned neck formation step. The object of the neck formation step is described below.

Before carrying out the seeing step, the front portion 35a of the seed crystal 35 is preheated to some extent. Ordinarily, there is a difference of 100° C. or more between the preheating temperature (about 1300° C. and less) and the melting point of the seed crystal 35 (about 1410° C.). Therefore, in dipping the seed crystal 35 into the melt 23, the seed crystal 35 experiences a steep rise in temperature, leading to the induction of dislocations generated by a thermal stress to the front portion 35a thereof. It is necessary to make the single crystal 36 grow after excluding the dislocations which inhibit single crystal growth. Since the dislocations generally tend to grow in the vertical direction to the growth interface of the single crystal 36, the shape of the growth interface (the front plane of the neck 36a) is made downward convex through the neck formation step, so as to exclude the dislocations.

In the neck formation step, the faster the pulling speed is made, the smaller the diameter of the neck 36a can be made. By making the shape of the growth interface more downward convex, the propagation of the dislocations can be prevented and the dislocations can be efficiently excluded.

In the above conventional method for pulling a single crystal, the seed crystal 35 having a diameter of 12 mm or more has been generally used in order to pull the single crystal 36 having a diameter of about 6 inches and a weight of 80 kg or so. In this case, the larger the diameter of the neck 36a is, the more safely the single crystal 36 can be supported, while the smaller the diameter of the neck 36a is, the more efficiently the dislocations can be excluded. In order to meet both of the requirements which are contrary to each other, the neck 36a having a diameter of 3 mm or so has been used so far. Recently, however, in order to produce a more highly integrated semiconductor device at a lower cost and more efficiently, the wafer has been required to have a larger diameter. Now, for example, the production of the single crystal 36 having a diameter of about 12 inches (300 mm) and a weight of 300 kg or so is desired. In this case, the neck 36a having a conventional diameter (usually 3 mm or so) cannot withstand the weight of the pulled single crystal 36 and breaks, resulting in the falling of the single crystal 36.

In growing the above heavy single crystal 36, the diameter of the neck 36a needs to be about 6 mm or more for safety, which is calculated from the silicon strength (about 16 kgf/mm$^2$) in order to prevent the occurrence of troubles such as a fall of the single crystal 36. However, when the diameter of the neck 36a is 6 mm or more, the dislocations which are induced in dipping the seed crystal 35 into the melt 23 cannot be sufficiently excluded.

In order to solve the above problem, a method for growing a heavy single crystal was proposed in Japanese Kokai No.

62-288191, wherein the diameter is once increased after growing the neck 36a, and is reduced and is increased again, so as to form a high-strength holding portion, which is mechanically held. It is possible to hold the heavy single crystal by the method, but a special jig, control, and the like for mechanical holding exclusive use are required in order to perform the mechanical holding in the method. In addition, when the mechanical holding is conducted on the high-strength holding portion, there is a high possibility that shaking or the like generates dislocations in the growing portion, resulting in a lower yield of the products.

The applicant of the present invention previously proposed a method for growing a single crystal 36 without forming a neck 36a, wherein the front portion 35a of a seed crystal 35 is gradually heated using a laser beam generator 11 (FIG. 3) or the like, and then, the seed crystal 35 is brought into contact with a melt 23 (Japanese Patent Application No. 08-43765). In the method, since the temperature of the front portion 35a of the seed crystal 35 can be made close to that of the melt 23 before the seed crystal 35 is brought into contact with the melt 23, a sudden change in temperature (thermal shock) caused in contact with the melt 23 can be reduced, so that the number of induced dislocations can be decreased. Therefore, even if the neck 36a is not formed, the single crystal 36 can be pulled with inhibiting the propagation of the dislocations, and it is possible to grow the single crystal 36 heavier than before.

However, since the seed crystal 35 can be heated only from one direction using the laser beam generator, it is difficult to uniformly heat the front portion 35a of the seed crystal 35. As a result, it is difficult to perfectly exclude the thermal shock in contact of the seed crystal 35 with the melt 23 so as to perfectly inhibit the induction of the dislocations.

The applicant of the present invention previously proposed a method for growing a single crystal in Japanese Kokai No. 09-235186, wherein using a seed crystal having a cylindrical body and a conical front portion, the temperature of the front portion of the seed crystal and that of a melt are made equal to each other in contact of the front portion thereof with the melt so as to prevent the induction of dislocations, part of the front portion is melted, and then, a single crystal is pulled without forming a neck.

The applicant of the present invention previously proposed a method for growing a single crystal in Japanese Kokai No. 09-249492, wherein using a seed crystal containing high-density impurities in which dislocations cannot easily propagate, the front portion of the seed crystal is brought into contact with a melt and is further lowered to melt the portion to which dislocations were induced in contact of the front portion thereof with the melt so as to exclude the dislocations, and then, a single crystal is pulled without forming a neck.

In these methods described in the publications, the neck formation step which has been required so far is unnecessary. Since the diameter of the single crystal hanging portion is not narrowed, it becomes possible to hold a heavy single crystal. Since the neck formation step is not required, the number of process steps can be reduced. It becomes possible to shorten the time for the dislocation-excluding process, which was required to be from one to nearly two hours hitherto, to from 10 to tens of minutes or so.

However, in the methods described in the publications, a seed crystal having a cylindrical body and a conical front portion or a seed crystal containing high-density impurities in which dislocations cannot easily propagate must be prepared. Those specific seed crystals are expensive.

In the actual pulling of a single crystal, there are cases where dislocations are induced to the single crystal for some reasons such as contamination of foreign substances during pulling, so that the subsequent pulling of the single crystal cannot be continued. In this case, the half-pulled single crystal is melted again up to the original seed crystal and the pulling of a dislocation-free single crystal is tried again. In the remelting, ordinarily, the process wherein the length of tens to hundreds of mm or so of the single crystal is dipped into the melt at a high speed of hundreds of mm/min so as to be fused, and then the single crystal is dipped again, is repeated. By a thermal shock during the process, dislocations are also induced to the seed crystal portion. In this case, since the dislocations are propagated by the action of a larger thermal stress than that in the case where the seed crystal is simply brought into contact with the melt, the number of dislocations induced upward to the seed crystal portion becomes large. It becomes difficult to use the seed crystal first set inside of the holder 24a as it is and make it dislocation-free. Therefore, in the remelting of a single crystal, it is necessary to discard the seed crystal after a single use and replace with a new seed crystal in order to ensure that the seed crystal is dislocation-free. Particularly, when a seed crystal having a cylindrical body and a conical front portion is used, the shape thereof is damaged by the remelting, so that the replacement of the seed crystal is indispensable.

The applicant of the present invention previously proposed a method for growing a single crystal in Japanese Kokai No. 10-310485, wherein high radiation is applied to a seed crystal and the interface portion between a single crystal and a melt, a straight thick neck portion having almost the same diameter as the seed crystal is grown without forming a constricted narrow portion such as a neck and a taper portion so as to exclude dislocations, and then, a single crystal is pulled. In the method, since the seed crystal is heated with high radiation, the thermal stress in the seed crystal and the neck portion is reduced, and the propagation and extension of dislocations are reduced so as to increase the capability to exclude dislocations during growing the straight body portion. Without reducing the crystal diameter as in the conventional neck formation step, the dislocations can be excluded. Since this method has a high dislocation-excluding capability, it is possible to exclude dislocations even if a few dislocations are existent in the seed crystal. Even after the remelting of the single crystal to which dislocations were induced, it is possible to exclude the dislocations without replacing the seed crystal with a new seed crystal. It is possible to reuse the same seed crystal for the next pulling without replacing the seed crystal after a series of pulling processes similarly.

However, in the method described in the publication, the side surface of the crystal is heated during growing the straight body portion, which is contrary to a physical phenomenon that a crystal is solidified by removing heat, being a fundamental principle of crystal growth. Therefore, this process requires a delicate heat balance. While the growth of the straight body portion requires skill of an operator, the pulling speed during the growth of the straight body portion cannot be so fast as a general pulling speed (2–4 mm/min) in a conventional neck formation step. As a result, the time required as long as that for the conventional neck formation step, about one to two hours is at least needed.

SUMMARY OF THE INVENTION

The present invention was developed in order to solve the above problems, and it is an object of the present invention to provide a method for pulling a single crystal wherein a single crystal hanging portion makes it possible to pull even a heavy single crystal safely, a new cost related to a seed crystal is not caused by the use of a general and usual seed crystal, the time required for the process can be shortened by making the single crystal hanging portion dislocation-free at a high speed, and even a seed crystal containing a few dislocations can be made dislocation-free, so that a seed crystal to which a few dislocations were induced can be reused without replacement, and an apparatus for pulling a single crystal.

In order to achieve the above object, a method for pulling a single crystal (1) according to the present invention, wherein a single crystal is grown by pulling a seed crystal after dipping the seed crystal into a melt within a crucible, is characterized by bringing the seed crystal into contact with the melt, further dipping the seed crystal into the melt while the vicinity of the interface between the seed crystal and the melt is heated using an auxiliary heating means, stopping the heating using the auxiliary heating means, and pulling a single crystal without forming a neck.

In the method for pulling a single crystal (1), since the seed crystal is dipped into the melt while the vicinity of the interface between the seed crystal and the melt is heated, the stress caused in the vicinity of the crystal interface is remarkably reduced. Even if a few dislocations are existent in the front portion of the seed crystal, the propagation and extension of the dislocations are appreciably inhibited. Since it is possible to melt the seed crystal portion containing the dislocations with keeping the dislocations fixed, the capability to exclude dislocations becomes high, so that the seed crystal can be easily made dislocation-free. Since the seed crystal is dipped into the melt while the vicinity of the interface between the seed crystal and the melt is heated, the side surface of the crystal is in a preheated state. As a result, new dislocations do not generate even if the seed crystal is dipped at a high speed, so that the time required for the dislocation-excluding process can be shortened. Furthermore, in the method for pulling a single crystal (1), the minimum diameter of the single crystal hanging portion is that of the seed crystal. Since a single crystal can be hung by a single crystal hanging portion having a larger diameter compared with that in a conventional neck process, a heavier single crystal than before can be sufficiently supported.

A method for pulling a single crystal (2) according to the present invention is characterized by preheating the front portion of the seed crystal using the auxiliary heating means before bringing the seed crystal into contact with the melt in the method for pulling a single crystal (1).

In the method for pulling a single crystal (2), since the front portion of the seed crystal is preheated using the auxiliary heating means before bringing the seed crystal into contact with the melt, a sudden change in temperature (thermal shock) in the front portion of the seed crystal is not caused by the dipping into the melt, so that the thermal stress caused thereby can be remarkably reduced. Accordingly, when a dislocation-free seed crystal is used, it is possible to appreciably reduce the induction of dislocations. Even when a seed crystal containing a few dislocations is used, it is possible to remarkably inhibit the propagation and extension of the dislocations. As a result, the above dislocation-excluding technique can be made more reliable.

A method for pulling a single crystal (3) according to the present invention is characterized by rotating the seed crystal when the front portion of the seed crystal is heated and/or when the seed crystal is dipped into the melt in the method for pulling a single crystal (1) or (2).

In the method for pulling a single crystal (3), even if the auxiliary heating means has a shape asymmetric to the axial center of the pulling axis, the front portion of the seed crystal can be easily heated further uniformly. It becomes possible to reduce the stress which occurs in the vicinity of the crystal interface, leading to melting the seed crystal with keeping the dislocations therein fixed. As a result, the dislocation-excluding capability can be improved.

A method for pulling a single crystal (4) according to the present invention is characterized by setting the lower end position of the auxiliary heating means within 30 mm above the melt surface in the method for pulling a single crystal (1).

Since the lower end of the auxiliary heating means is located within 30 mm above the melt surface, the interface portion between the melt and the seed crystal can be sufficiently heated. It becomes possible to reduce the stress which occurs in the vicinity of the crystal interface, leading to melting the seed crystal with keeping the dislocations therein fixed. As a result, the dislocation-excluding capability can be improved.

A method for pulling a single crystal (5) according to the present invention is characterized by the length of the seed crystal to be dipped into the melt being two times the diameter of the seed crystal or longer in the method for pulling a single crystal (1).

Generally speaking, when a dislocation generates, the dislocation propagates to the length as long as the seed crystal diameter from the dislocation generation position. Accordingly, in order to make the seed crystal dislocation-free after contact with the melt, the dip length as long as the seed crystal diameter from the position where the seed crystal comes into contact with the melt is not sufficient. As described above, in the method wherein the seed crystal is dipped into the melt while the vicinity of the interface between the seed crystal and the melt is heated, the dislocations induced to the seed crystal are remarkably inhibited from propagating and extending, but not all of them are excluded. A few dislocations propagate and extend. In the above method for pulling a single crystal (5), since the length of the seed crystal to be dipped into the melt is two times the seed crystal diameter or longer, the portion where the dislocations propagated and extended can be also melted into the melt even if a few dislocations were induced into the front portion of the seed crystal, and propagated and extended only short when the seed crystal was brought into contact with the melt. As a result, it can be certain that there are no dislocations in the seed crystal at the finish of melting.

An apparatus for pulling a single crystal (1) according to the present invention, comprising a crucible to be charged with a melt, a heater arranged around the crucible and the like, is characterized by having an auxiliary heating means, comprising a heating member which surrounds half or more of the horizontal perimeter of a seed crystal with an opening for withdrawing from the seed crystal and can be located so as to surround the seed crystal located near above the melt, and a transfer mechanism for withdrawing the heating member from the single crystal passing area.

Using the apparatus for pulling a single crystal (1), the auxiliary heating means makes it possible to dip the seed crystal into the melt while the vicinity of the interface between the seed crystal and the melt is heated. In addition, since the heating member surrounds half or more of the horizontal perimeter of the seed crystal, the interface between the seed crystal and the melt can be uniformly heated, so that the stress which occurs in the vicinity of the crystal interface can be remarkably reduced. Even if a few dislocations are existent in the front portion of the seed crystal, the dislocations are appreciably inhibited from propagating and extending. Thus, since it is possible to melt the portion containing the dislocations with keeping the dislocations in the seed crystal fixed, the dislocation-excluding capability is high and the seed crystal can be easily made dislocation-free.

Using the apparatus for pulling a single crystal (1), since the auxiliary heating means makes it possible to dip the seed crystal into the melt while the vicinity of the interface between the seed crystal and the melt is heated, the side surface of the seed crystal is in a preheated state. Therefore, even when the seed crystal is dipped into the melt at a high speed, new dislocations are not generated, so that the time required for the dislocation-excluding process can be shortened. Furthermore, using the apparatus for pulling a single crystal (1), a single crystal with the single crystal hanging portion whose minimum diameter is that of the seed crystal can be pulled. Since the crystal can be hung by a single crystal hanging portion having a larger diameter than that in the growth by a conventional neck process, a heavier single crystal than before can be sufficiently supported.

Using the apparatus for pulling a single crystal (1), since the heating member can be withdrawn from the single crystal passing area when the shoulder formation step is started during the single crystal pulling, the existence of the heating member is out of the way in the process of single crystal pulling.

An apparatus for pulling a single crystal (2) according to the present invention is characterized by the heating member which comprises plural movable heating members in the apparatus for pulling a single crystal (1).

Using the apparatus for pulling a single crystal (2), since the heating member comprises plural movable heating members, the seed crystal can be uniformly heated more certainly, so that the seed crystal can be made dislocation-free more easily.

An apparatus for pulling a single crystal (3) according to the present invention is characterized by the heating member at least comprising a carbon material, and a coating material or a covering body on the carbon material surface in the apparatus for pulling a single crystal (1).

Using the apparatus for pulling a single crystal (3), since at least the heating member comprises a carbon material, and a coating material or a covering body which covers the carbon material, the occurrence of the situation where impurities contained in the carbon material are released from the heating member and have a bad influence upon a single crystal to be pulled can be prevented even when the heating member becomes hot. As the coating material, silicon carbide is preferable, when it is conditioned that the coating material should not release contamination materials in itself and that it is not pyrolyzed at high temperatures. The construction wherein the carbon material is covered with the covering body made of transparent quartz may also be good. However, the materials constituting the coating material or the covering body are not limited to the above materials. Other materials which satisfy the conditions of contamination and heat resistance may also be used.

An apparatus for pulling a single crystal (4) according to the present invention is characterized by having an image processing unit which can watch variations in diameter of the seed crystal when the seed crystal is dipped into the melt, and a seed crystal diameter control means which conducts feedback on the variations in diameter of the seed crystal detected by the image processing unit to an electric power supply control means to the auxiliary heating means and to a descent speed control means of the seed crystal, and automatically controls the seed crystal diameter in such a manner as to be kept a fixed value in the apparatus for pulling a single crystal (1).

Using the apparatus for pulling a single crystal (4), the occurrence of a trouble wherein an electric power supply becomes excessive when the seed crystal is dipped into the melt, resulting in fusion of the seed crystal can be prevented.

BRIEF DESCRIPTION OF THE DRAWINGS

FIGS. 2(a)–2(d) are partial enlarged front views schematically showing a seed crystal and the vicinity thereof in part of the steps in a conventional method for pulling a single crystal;

DETAILED DESCRIPTION OF THE PREFERRED EMBODIMENTS

The preferred embodiments of the method and apparatus for pulling a single crystal according to the present invention are described below by reference to the Figures of the drawings.

In the method for pulling a single crystal according to the embodiments, it is premised that a single crystal having a large diameter of 12 inches or more and a heavy weight is pulled.

Figure 4:
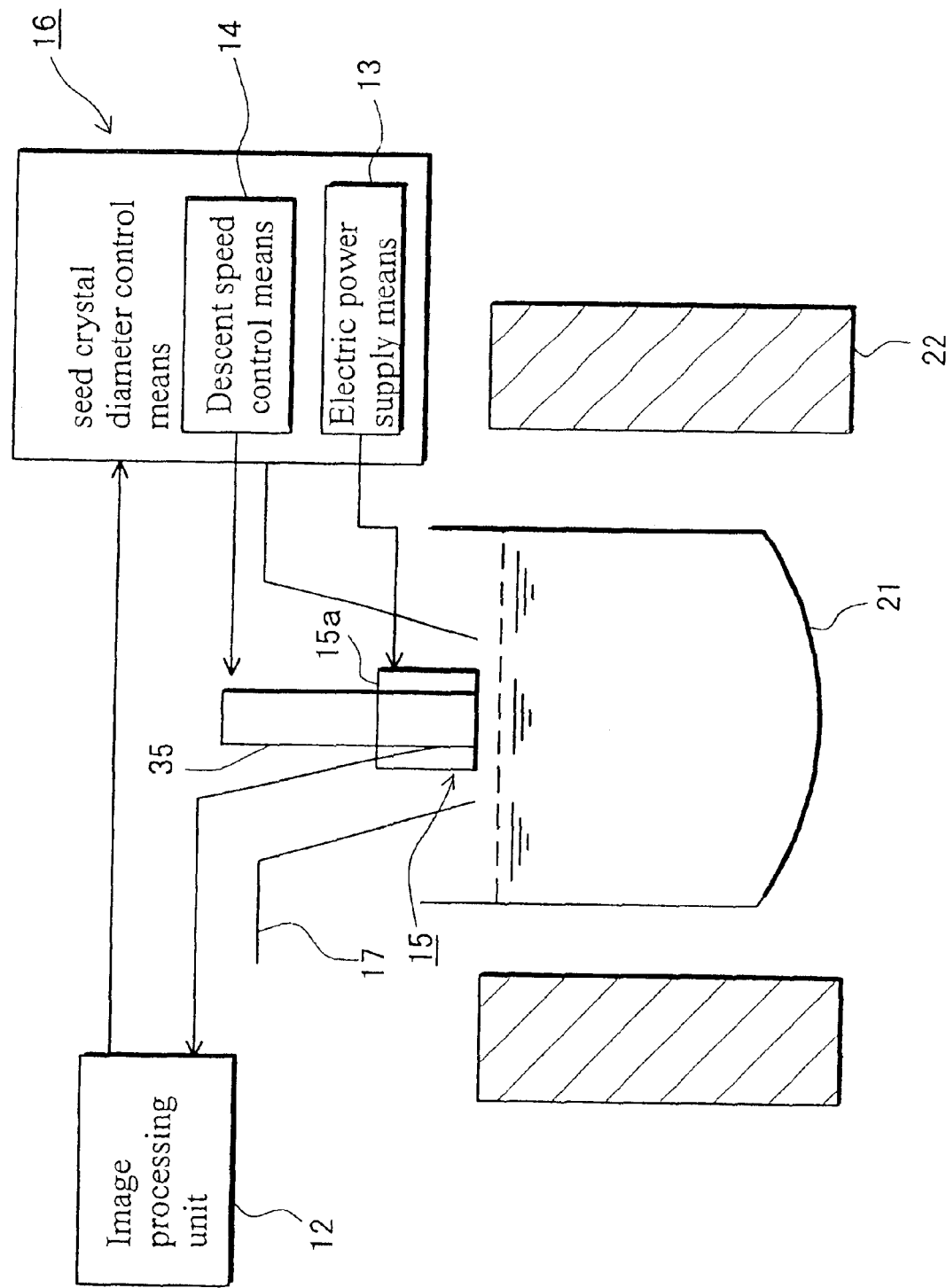
FIG. 4 is a schematic sectional view showing an apparatus for pulling a single crystal according to an embodiment of the present invention.
Figure 5:
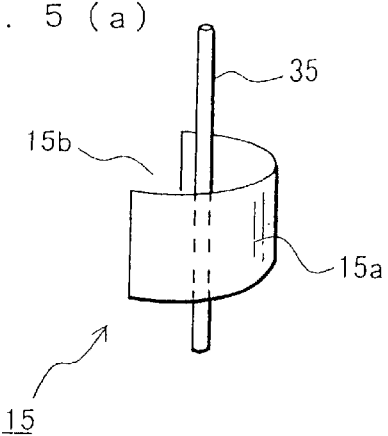
FIGS. 5(a)–5(d) are perspective and front views schematically showing the forms of heating members according to embodiments.
Figure 5:
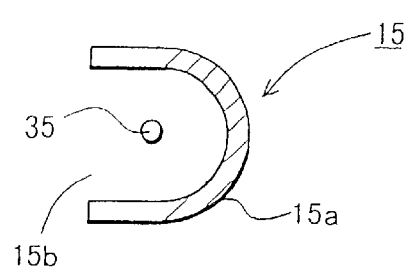
Figure 5:
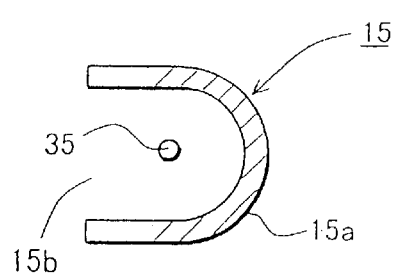
Figure 5:
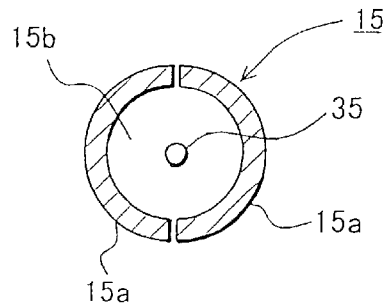

FIG. 4 is a schematic sectional view showing an apparatus for pulling a single crystal according to an embodiment. The apparatus for pulling a single crystal shown in FIG. 4 has an auxiliary heating means 15, comprising a heating member 15a which surrounds half or more of the horizontal perimeter of a seed crystal 35 with an opening 15b for withdrawing from the seed crystal 35 as shown in FIG. 5 and can be located so as to surround the seed crystal 35 located near above a melt 23, and a transfer mechanism (not shown) for withdrawing the heating member 15a from the passing area of a single crystal 36.

The heating member 15a in the auxiliary heating means 15 shown in FIG. 5(c) comprises a curved surface-shaped member having the opening 15b which is U-shaped in a plan view. In an apparatus for pulling a single crystal according to another embodiment, the heating member 15a may comprise plural movable heating members 15a, so that they can surround almost the whole horizontal periphery of the seed crystal 35. The whole-circumferential heating member 15a having a segmental construction is preferable from the viewpoint of uniform heating of the seed crystal 35.

At least the heating member 15a in the auxiliary heating means 15 comprises a carbon material and a silicon carbide material coating the surface of the carbon material, and it is more desirable that the transfer mechanism should also comprise a carbon material and a silicon carbide material coating the surface of the carbon material. Thus, by making the auxiliary heating means 15 of the carbon material and the silicon carbide material coating the surface of the carbon material, it is possible to prevent the occurrence of the situation where impurities are released from the heating member 15a and have a bad influence upon a single crystal 36 to be pulled, even if the heating member 15a becomes hot. Here, the heating region in the heating member 15a is shown by hatches in the figure.

The apparatus for pulling a single crystal shown in FIG. 4 has an image processing unit 12 which can watch variations in diameter of the seed crystal 35 when the seed crystal 35 is dipped into a melt 23, and a seed crystal diameter control means 16, which conducts feedback on the variations in diameter of the seed crystal 35 detected by the image processing unit 12 to an electric power supply control means 13 to the auxiliary heating means 15 and to a descent speed control means 14 of the seed crystal 35, and automatically controls the diameter of the seed crystal 35 in such a manner as to be kept a fixed value.

A method for pulling a single crystal using the above apparatus for pulling a single crystal is described below.

FIGS. 6(a)–6(d) are partial enlarged front views schematically showing a seed crystal 35 and the vicinity thereof when part of the steps of the method for pulling a single crystal 36 according to an embodiment are carried out.

The steps before the below-described steps are carried out in the same manner as described in "Description of the Relevant Art".

Figure 6:
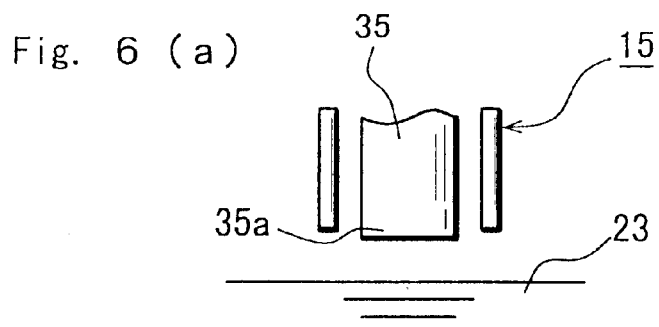
FIGS. 6(a)–6(d) are partial enlarged front views schematically showing a seed crystal and the vicinity thereof in part of the steps in a method for pulling a single crystal according to an embodiment.
Figure 6:
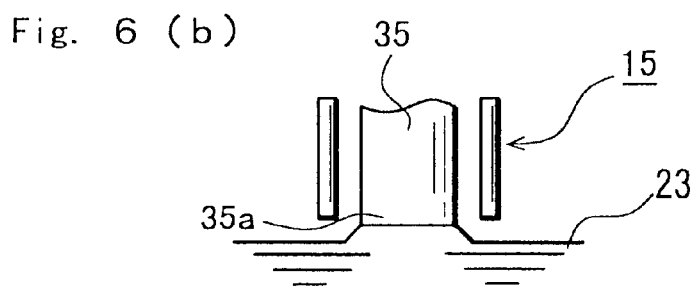
Figure 6:
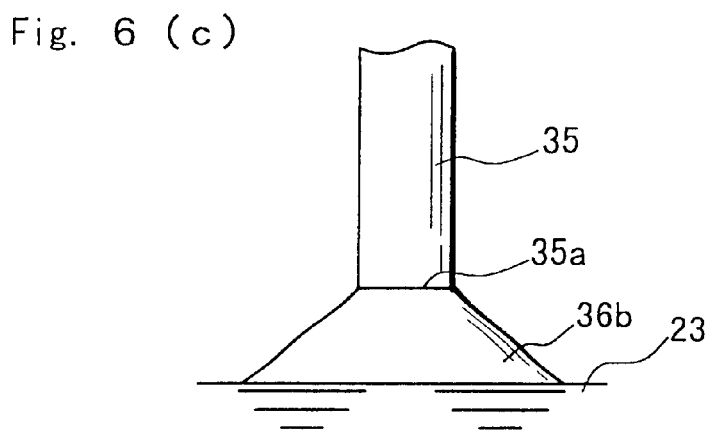
Figure 6:
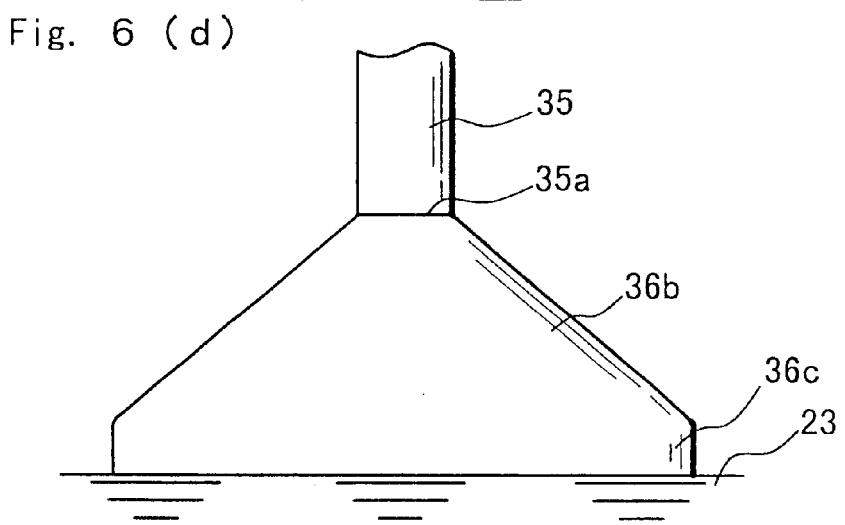

While a pulling axis 24 (FIG. 1) is rotated on the same axis in the reverse direction of a support shaft 28 (FIG. 1) at a prescribed speed, the seed crystal 35 held by a holder 24a (FIG. 1) is caused to descend near above the melt 23 and is preheated (FIG. 6(a)).

The diameter of the seed crystal 35 is preferably within the range of 5–10 mm. When the diameter of the seed crystal 35 is less than 5 mm, it is difficult to support a heavy single crystal 36 having a diameter of 12 inches or so and a weight of more than 300 kg. On the other hand, when the diameter of the seed crystal 35 exceeds 10 mm, the single crystal 36 can be sufficiently supported, but it is difficult to uniformly heat the too large seed crystal 35 using the auxiliary heating means 15. As a result, since the thermal stress generated in the seed crystal 35 increases, it is difficult to exclude dislocations.

By spending 5–60 minutes or so on the preheating, the temperature of the front portion 35a of the seed crystal 35 is raised to 1200–1300° C. or so. The then distance between the melt 23 and the lower end of the seed crystal 35 is preferably within the range of 1–30 mm. It is desired that the front portion 35a of the seed crystal 35 should be further heated using the auxiliary heating means 15 after the preheating so as to raise the temperature of the front portion 35a to 1380–1420° C. When the temperature of the front portion 35a of the seed crystal 35 is 1380° C. or more, the occurrence of dislocations generated by the thermal stress can be remarkably inhibited during the process wherein the seed crystal 35 is caused to descend and the front portion 35a thereof is brought into contact with the melt 23.

Here, when the temperature of the font portion 35a of the seed crystal 35 exceeds 1420° C., the seed crystal 35 begins to melt at the portion close to the auxiliary heating means 15. But in the process wherein the seed crystal 35 is caused to descend and the front portion 35a thereof is brought into contact with the melt 23, the possibility that the seed crystal 35 is fused becomes high when the temperature of the melt 23 is higher than expected, or when the temperature variation on the surface of the melt 23 is large.

The seed crystal 35 is caused to descend and the front portion 35a thereof is dipped into the melt 23 (FIG. 6(b)). In contact with the melt 23, the thermal stress in the seed crystal 35 caused by a temperature difference is small since the difference between the temperature of the front portion 35a of the seed crystal 35 and that of the melt 23 is small. Therefore, when a dislocation-free seed crystal is used as the seed crystal 35, dislocations are hardly induced. Dislocations do not propagate nor extend, even when the seed crystal 35 is brought into contact with the melt 23 again in the re-pulling using the seed crystal 35 containing a few dislocations such as the seed crystal 35 obtained after the single crystal 36 is remelted because of the induction of dislocations thereto during pulling the single crystal 36.

Then, while the interface between the seed crystal 35 and the melt 23 is heated using the auxiliary heating means 15, the seed crystal 35 is further caused to descend, and the front portion 35a thereof is dipped into the melt 23 and is melted to the length of two times the diameter of the seed crystal 35 or longer. By heating the interface between the seed crystal 35 and the melt 23 using the auxiliary heating means 15, the thermal stress in the seed crystal 35 is remarkably reduced. Therefore, even when the front portion 35a of the seed crystal 35 is dipped into the melt 23, the dislocations induced to the front portion 35a thereof do not propagate and not extend. By heating the side surface of the seed crystal 35 using the auxiliary heating means 15, the temperature of the side surface of the seed crystal 35 is raised close to that of the melt 23. Therefore, even when the seed crystal 35 is dipped into the melt 23 at a high speed, the thermal stress is not generated by a temperature difference and new dislocations are not induced. Thus, it is possible to make a dislocation-free crystal at a high speed. The cost can be reduced by higher efficiency and reduction of the steps.

Then, the electric power supply to the auxiliary heating means 15 is stopped, the heating member 15a is withdrawn from the periphery of the seed crystal 35, and the single crystal 36 is grown to have a prescribed diameter (12 inches or so) without forming a neck, resulting in the formation of a shoulder 36b (FIG. 6(c)).

The single crystal 36 is pulled at a prescribed pulling speed to form a main body 36c (FIG. 6(d)).

Then, the single crystal 36 is pulled in the same manner as described in "Description of the Relevant Art", and the pulling of the single crystal 36 is completed by separating the single crystal 36 from the melt 23 and cooling.

Here, in the above embodiment, the case wherein the auxiliary heating means 15 comprising a carbon material (graphite) is used as a heating means of the seed crystal 35. But the auxiliary heating means according to the present invention is not limited to it. For example, as disclosed in Japanese Kokai No. 10-310485, an auxiliary heating means wherein the gap between a straightening vane and the melt surface is made large to heat a seed crystal by the radiation from a heater and the gap between the straightening vane and the melt surface is made small to reduce the radiation after dipping the seed crystal so as to stop heating the seed crystal can show the same effect.

In the above embodiment, the case wherein the present invention is applied to the CZ method is described, but the application of the present invention is not limited to the CZ method. It is also applicable to the MCZ method wherein a magnetic field is applied.

EXAMPLES

The method and apparatus for pulling a single crystal according to Examples and Comparative Examples are described below. The conditions are as follows.

Common Conditions to Examples 1–9 and Comparative Examples 1–9

Shape of single crystal 36 to be pulled
  Diameter about 300 mm (12 inches)
  Length: about 1100 mm
  Weight: 205–215 kg
Prepared quantity of material for crystal: 240 kg
Inner diameter of crucible 21: 30 inches
Atmosphere in chamber 29: Ar atmosphere
  Flow of Ar: 100 liter/min
  Pressure: $1.33 \times 10^3$ Pa
Rotation speed of pulling axis 24: 6 rpm
Rotation speed of crucible 21: 5 rpm The number of pulled DF (Dislocation Free) single crystals 36 were examined by a visual check, and etching was further conducted on the single crystals which were judged as being Dislocation Free (DF) so as to ascertain that no dislocations were found on the sure thereof.

Common Condition to Example 1, and Comparative Examples 1 and 2

Rotation speed of seed crystal 35 before contact with melt: 10 rpm

Different Conditions in Example 1, and Comparative Examples 1 and 2

Figure 1:
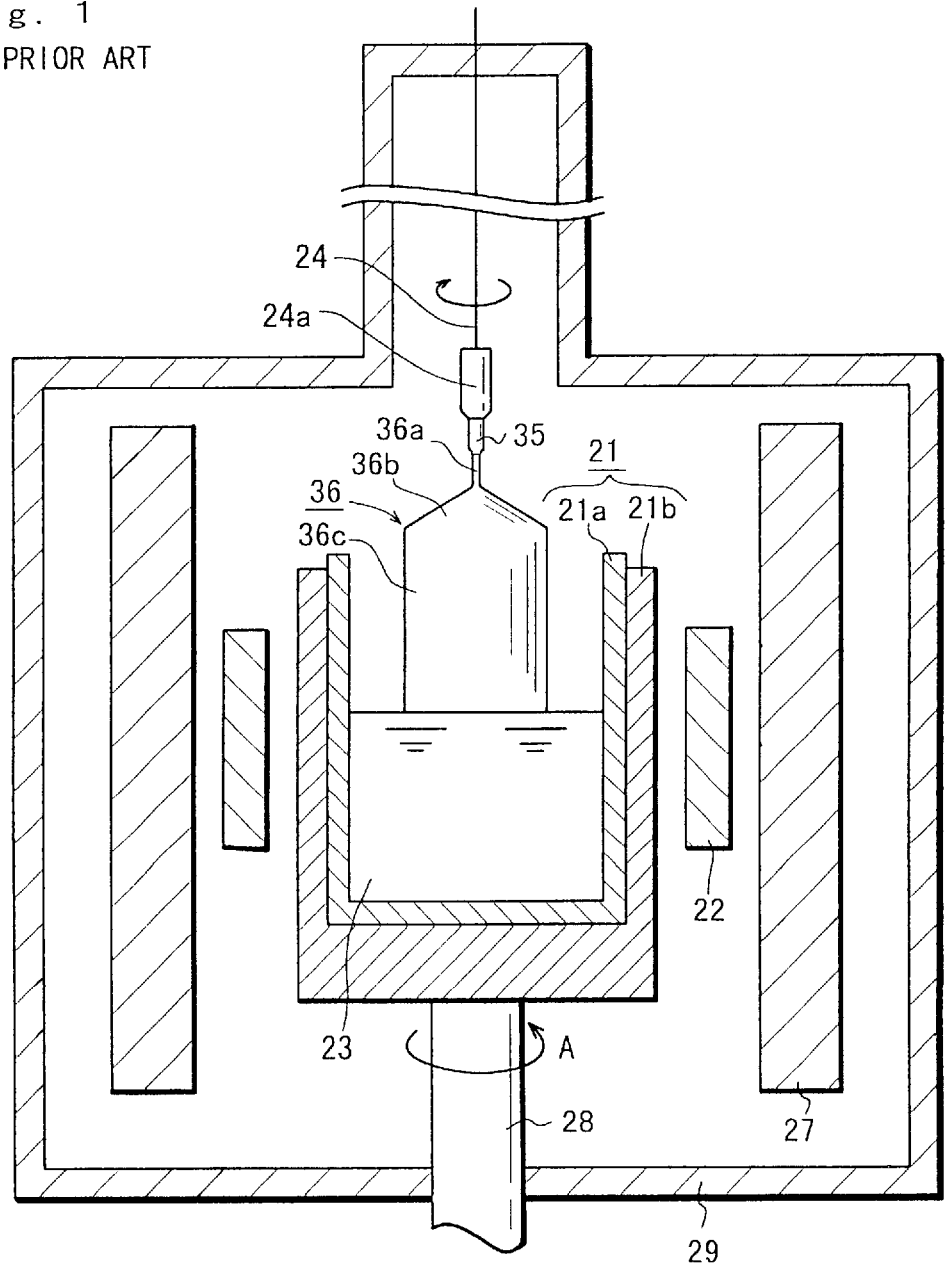
FIG. 1 is a schematic sectional view showing a conventional apparatus for pulling a single crystal used for the CZ method.
Figure 3:
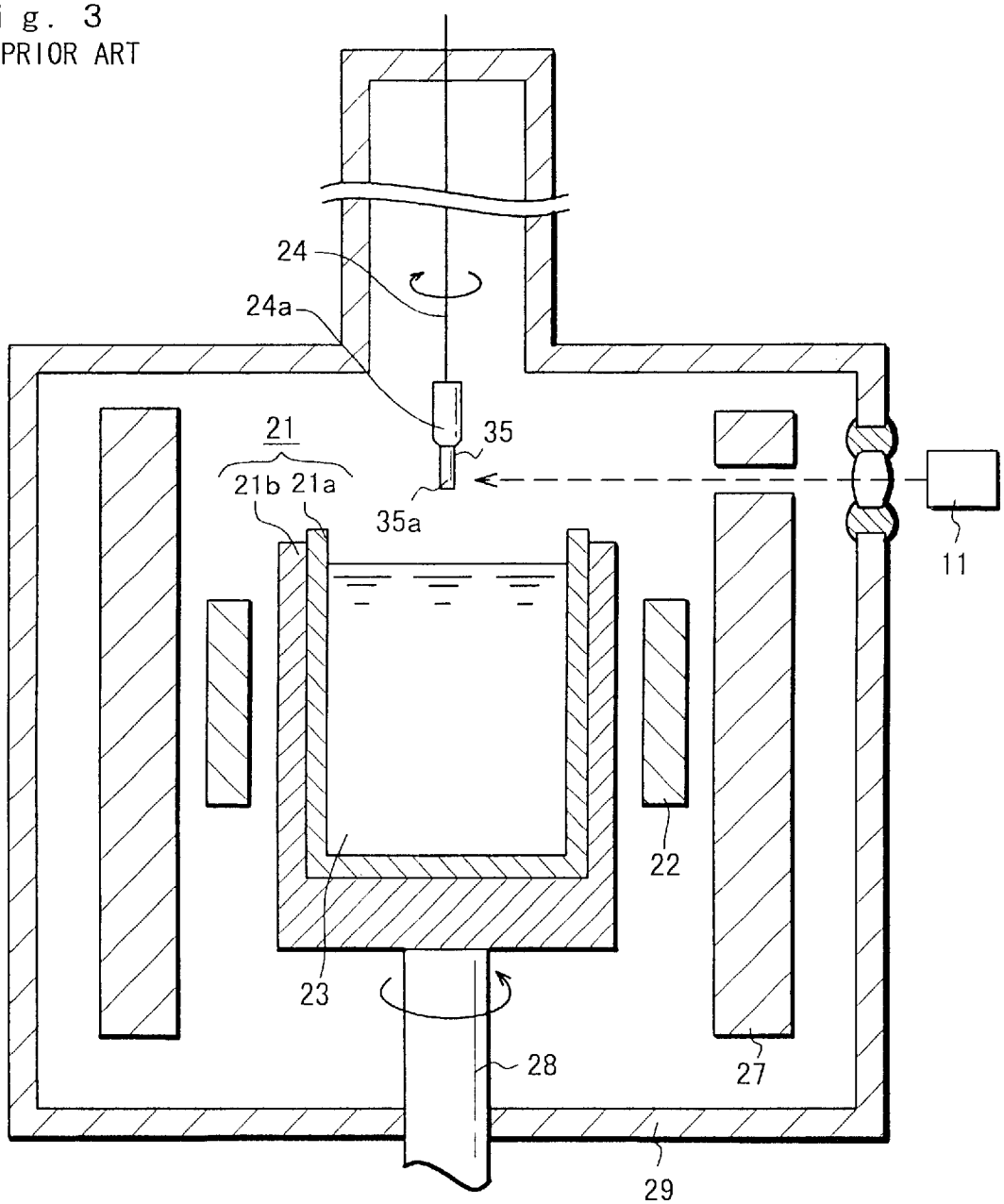
FIG. 3 is a schematic sectional view showing an example of a conventional apparatus for pulling a single crystal.

In the case of Example 1, using the apparatus shown in FIG. 4, single crystals were pulled by the method according to the present invention;

in the case according to Comparative Example 1, using the conventional apparatus shown in FIG. 1, single crystals were pulled by the conventional method wherein the diameter of a neck 36a is narrowed; and in the case according to Comparative Example 2, single crystals were pulled by the method described in Japanese Kokai No. 10-310485, which is a high radiation method wherein a seed crystal 35 is brought into contact with a melt after being sufficiently preheated under a high radiation condition generated by a heater 22 near above the melt 23 without narrowing the diameter of a neck 36a.

Other different conditions are shown in Table 1.

Results of Example 1, and Comparative Examples 1 and 2

The growth speed of a neck, or dipping speed of a seed crystal, the growth length of the neck, or dipped length of the seed crystal, the neck diameter in dislocation-excluding, or seed crystal diameter, and the number of pulls in the cases of Example 1 and Comparative Examples 1 and 2 are shown in Table 1.

TABLE 1

|  |  | Growth Speed (Dipping Speed) | Growth Length (Dipped Length) | Crystal Diameter in Dislocation-excluding | Number of Pulls |
|---|---|---|---|---|---|
| Comparative Example 1 | Dash Method | 2.5–3.5 mm/min | 150 mm | 4.5–5.5 mm | 7 |
| Comparative Example 2 | High Radiation Neck Method | 1.0–2.0 mm/min | 100 mm | 7.9–9.0 mm | 5 |
| Example 1 |  | 3.0–6.0 mm/min | 25 mm | 10.0 mm | 5 |

In any case of Example 1 and Comparative Examples 1 and 2, the single crystals were made DF successfully, but in the case of the conventional Dash method (Comparative Example 1), it took one hour or so to form a neck 36a and two pulls were redone because of faulty narrowing control of the neck 36a;

in the case of the high radiation neck method (Comparative Example 2, the method described in Japanese Kokai No. 10-310485), it took from one and a half to two hours to form a neck 36a; and in the case of the method according to Example 1, it took only 10 minutes or so for dislocation eliminating.

In the case of the Dash method (Comparative Example 1), there were two falls, but in the cases of Comparative Example 2 and Example 1, no single crystals 36 fell.

Common Conditions to Example 2 and Comparative Examples 3–5

Apparatus used: apparatus shown in FIG. 4
Diameter of seed crystal 35: 10 mm
Distance between heating member 15a and melt surface: 20 mm
Dipped length of seed crystal 35: 20 mm

Different Conditions in Example 2 and Comparative Examples 3–5

Rotation speed of seed crystal 35 before contact with melt

Results of Example 2 and Comparative Examples 3–5

The influence of the rotation speed of the seed crystal 35 before contact with the melt is shown in Table 2.

TABLE 2

|  | Rotation Number of Seed Crystal | Number of DF |
|---|---|---|
| Comparative Example 3 | 0 rpm | 0/3 |
| Comparative Example 4 | 3 rpm | 0/3 |
| Comparative Example 5 | 7 rpm | 2/3 |
| Example 2 | 10 rpm | 5/5 |

In the case of Example 2 wherein the rotation speed of the seed crystal 35 before contact with the melt was 10 rpm, the single crystals were made DF successfully, but in either case of Comparative Examples 3 and 4 wherein the rotation speeds of the seed crystals 35 before contact with the melt were 0 and 3, respectively, the single crystals were not made DF successfully. In the case of Comparative Example 5 wherein the rotation speed of the seed crystal 35 before contact with the melt was 7 rpm, the single crystals were made DF, but there was a problem in repeatability.

As to the lower limit of the rotation speed of the seed crystal 35 before contact with the melt, it is difficult to determine one limit since it is affected by the construction and shape of the heating member 15a, and the construction of the whole apparatus, but 7 rpm or so can be a sort of standard.

Common Conditions to Examples 3–5 and Comparative Example 6

Apparatus used: apparatus shown in FIG. 4
Diameter of seed crystal 35: 10 mm
Dipped length of seed crystal 35: 20 mm Different Conditions in Examples 3–5 and Comparative Example 6

Distance between heating member 15a and melt surface

Results of Examples 3–5 and Comparative Example 6

The influence of the distance between the heating member 15a and the melt surface is shown in Table 3.

TABLE 3

|  | Distance between Heating Member and Melt Surface | Number of DF |
| --- | --- | --- |
| Example 3 | 20 mm | 5/5 |
| Example 4 | 25 mm | 3/3 |
| Example 5 | 30 mm | 3/3 |
| Comparative Example 6 | 35 mm | 2/3 |

In the case of Comparative Example 6 wherein the distance between the heating member 15a and the melt surface was 35 mm or more, there was a problem in repeatability of DF crystal-making, but in any case of Examples 3–5 wherein the distance between the heating member 15a and the melt surface was less than 35 mm, the DF crystals were successfully made with a good repeatability.

The distance between the heating member 15a and the melt surface of less than 10 mm appears to be desirable from the viewpoint of DF crystal-making, but since the risk of contact of the heating member 15a with the melt surface increases, it is not desirable from the viewpoint of safety in the process.

Common Conditions to Examples 6 and 7, and Comparative Examples 7 and 8

Apparatus used: apparatus shown in FIG. 4
Diameter of seed crystal 35: 10 mm
Distance between heating member 15a and melt surface: 20 mm
Rotation speed of seed crystal 35 before contact with melt: 10 rpm Different Conditions in Examples 6 and 7, and Comparative Examples 7 and 8

Dipped length of seed crystal 35

Results of Examples 6 and 7, and Comparative Examples 7 and 8

The influence of the dipped length of the seed crystal 35 is shown in Table 4.

TABLE 4

|  | Dipped Length of Seed Crystal | Number of DF |
| --- | --- | --- |
| Comparative Example 7 | 10 mm | 0/3 |
| Comparative Example 8 | 15 mm | 2/3 |
| Example 6 | 20 mm | 5/5 |
| Example 7 | 25 mm | 5/5 |

In the cases of Examples 6 and 7 wherein the dipped length of the seed crystal 35 was two times the diameter of the seed crystal 35 or longer, all of the single crystals were made DF successfully, but in the cases of Comparative Examples 7 and 8 wherein the dipped length of the seed crystal 35 was less than two times the diameter of the seed crystal 35, no single crystals were made DF successfully, or there was a problem in repeatability.

Common Conditions to Examples 8 and 9, and Comparative Example 9

Apparatus used: apparatus shown in FIG. 4 except for heating member 15a
Diameter of seed crystal 35: 10 mm
Distance between heating member 15a and melt surface: 20 mm
Rotation speed of seed crystal 35 before contact with melt: 10 rpm
Dipped length of seed crystal 35: 20 mm Different Conditions in Examples 8 and 9, and Comparative Example 9

The shape and region of the heating member 15a were varied as shown in FIGS. 5(*b*)–5(*d*).

Results of Examples 8 and 9, and Comparative Example 9

The influence of the shape and region of the heating member 15a is shown in Table 5.

TABLE 5

|  | Shape of Heating Member | Number of DF |
| --- | --- | --- |
| Comparative Example 9 | (b) | 0/3 |
| Example 8 | (c) | 5/5 |
| Example 9 | (d) | 5/5 |

In the cases of Examples 8 and 9 wherein the heating member 15a had a shape and a region surrounding half or more of the horizontal perimeter of the seed crystal 35 as shown in FIGS. 5(*c*) and 5(*d*), respectively, all of the single crystals were made DF successfully. But in the case of Comparative Example 9 wherein the heating member 15a had a shape and a region surrounding less than half of the horizontal perimeter of the seed crystal 35 as shown in FIG. 5(*b*), no crystals were made DF successfully.

Common Conditions to Examples 10–13 and Comparative Examples 10–13

Apparatus used: apparatus shown in FIG. 4 except for heating member 15a
Diameter of seed crystal 35: 10 mm
Distance between heating member 15a and melt surface: 20 mm Rotation speed of seed crystal 35 before contact with melt: 10 rpm Dipped length of seed crystal 35: 20 mm

Different Conditions in Examples 10–13 and Comparative Examples 10–13

The shape and region of the heating member 15a were as shown in FIG. 5(c). In Examples 10–13, the heating member 15a comprised a carbon material and a silicon carbide material coating the surface of the carbon material, while in Comparative Examples 10–13, the heating member 15a comprised a carbon material, whose surface was not coated with a silicon carbide material.

Results of Examples 10–13 and Comparative Examples 10–13

Figure 7:
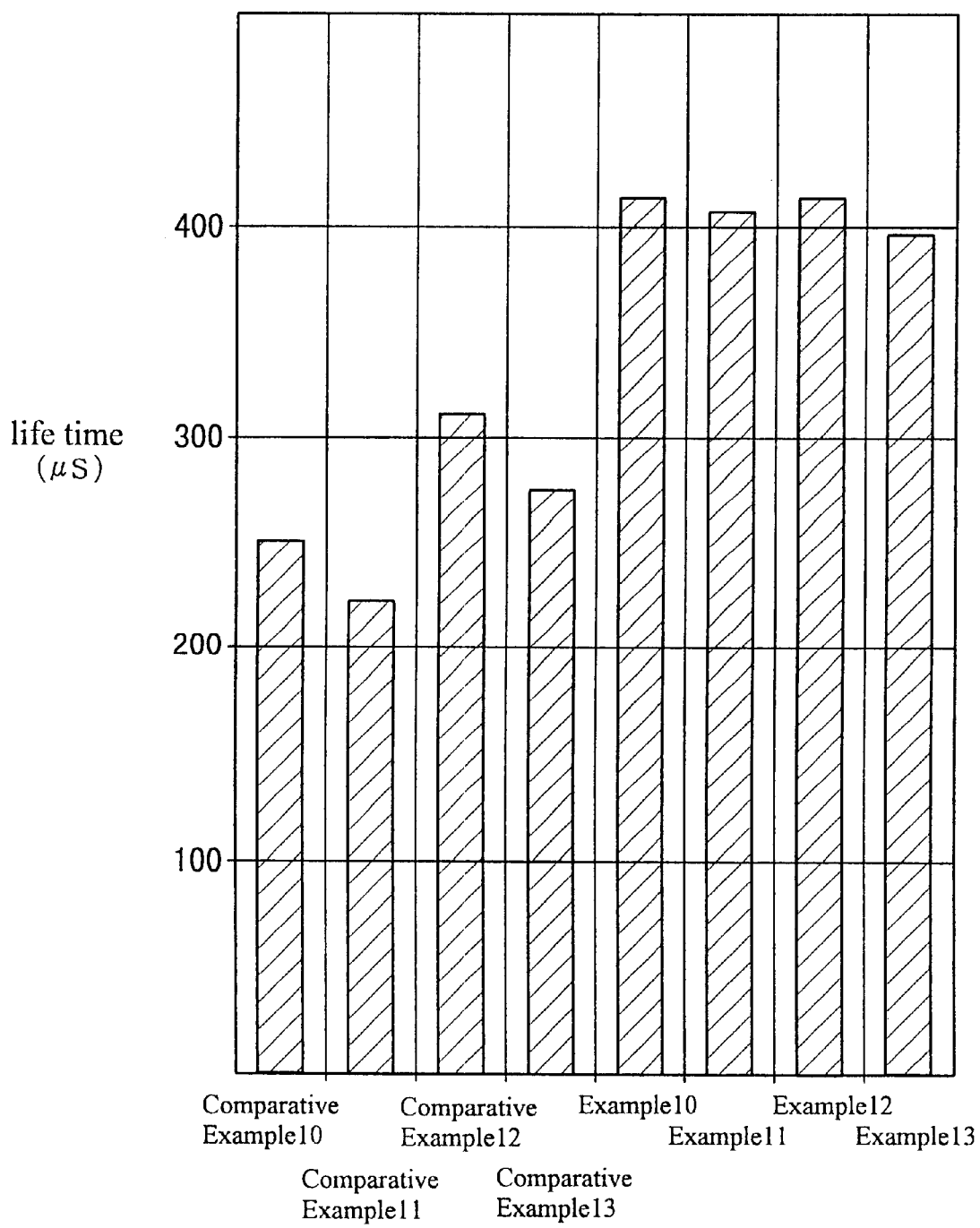
FIG. 7 is a graph indicating the lifetime of wafers according to Examples and Comparative Examples.

The influence of the material of the heating member 15a on the crystal quality was examined by measuring the lifetime value of wafers. The results of lifetime are shown in FIG. 7.

Wafers were produced from the pulled single crystals and the lifetime value was measured in the portion 3 mm inside from the circumference of the wafers.

In the cases according to Comparative Examples wherein the single crystals were pulled using the heating member 15a on which coating was not conducted, there were many wafers having a lifetime of 300 μs or less, while in the cases according to Examples wherein the single crystals were pulled using the heating member 15a on which coating was conducted, the lifetime of each wafer reached 400 μs or so.

Common Conditions to Example 14 and Comparative Examples 14 and 15

Apparatus shown in FIG. 4 was used.

Shape of single crystal 36 to be pulled
  Diameter: about 300 mm (12 inches)
  Length: about 1600 mm
  Weight: about 270 kg Prepared quantity of material for crystal: 300 kg Inner diameter of crucible 21: 32 inches Atmosphere in chamber 29: Ar atmosphere
  Flow of Ar: 100 liter/min
  Pressure: $1.33 \times 10^3$ Pa Rotation speed of seed crystal 35: 10 rpm Dipping speed of seed crystal 35: 3–6 mm/min Rotation speed of pulling axis 24: 6 rpm Rotation speed of crucible 21: 5 rpm Number of pulls: three times in every Example and Comparative Example

Different Conditions in Example 14, and Comparative Examples 14 and 15

The diameter of the seed crystal 35 to be used was varied as shown in Table 6 to carry out the experiments.

Examination of the Number of Pulled DF (Dislocation Free) Single Crystals

The examination was conducted by a visual check, and etching was further conducted on the single crystals which were judged as being Dislocation Free (DF) so as to ascertain that no dislocations were found on the sure thereof.

By the measurement, the ratio of Dislocation Free (DF) single crystals among three pulled single crystals was found.

Results of Example 14, and Comparative Examples 14 and 15

The DF rate of the single crystals and the number of falls in the cases of Example 14 and Comparative Examples 14 and 15 are shown in Table 6.

TABLE 6

|  | Diameter of Seed Crystal | Number of DF | Number of Falls |
| --- | --- | --- | --- |
| Comparative Example 14 | 4 mm | 3/3 | 3/3 |
| Example 14 | 8 mm | 3/3 | 0/3 |
| Comparative Example 15 | 12 mm | 1/3 | 0/3 |

As is obvious from the results shown in Table 6, in the cases of Example 14 and Comparative Example 14, since dislocations were not induced to the seed crystals 35, the number of the pulled DF single crystals 36 was 3/3, which means that no dislocations generated, even when the single crystals were pulled without forming a neck 36a. However, in the case of Comparative Example 14, since the diameter of the used seed crystal 35 was 4 mm, which was small, the number of falls was 3/3.

In the case of Comparative Example 15, since the diameter of the used seed crystal 35 was 12 mm, which was sufficiently large, the number of falls was 0/3. But it was difficult to uniformly heat the seed crystal 35, so that dislocations were induced to the seed crystal 35 and the dislocations could not be excluded. The number of DF crystals was 1/3, which means that dislocations generated in the single crystals 36.

Example 15 and Comparative Example 16

In Example 15 and Comparative Example 16, the experiments on the possibility of the successive use of the seed crystal 35 were conducted and the results were compared.

The single crystals 36 were pulled by the methods according to Example 1 (Example 15) and Comparative Example 2 (Comparative Example 16). After the pulled single crystals 36 were remelted or cut, the single crystals 36 were pulled successively without replacing the seed crystals 35, and the DF rates were compared.

In the case of Comparative Example 16, 4 single crystals had dislocations among 5 pulls, since it appears that the seed crystal 35 could not be made Dislocation Free perfectly. On the other hand, in the case of Example 15, no dislocations generated in all of 7 pulls. The seed crystal 35 was gradually shortened by the successive use thereof, but the seed crystal 35 could be made Dislocation Free till it became too short to be used.

What is claimed is:

1. A method for pulling a single crystal wherein a single crystal is grown by pulling a seed crystal after dipping the seed crystal into a melt within a crucible, comprising the steps of bringing the seed crystal into contact with the melt, further dipping the seed crystal into the melt while the vicinity of the interface between the seed crystal and the melt is heated using an auxiliary heating means, stopping the heating with the auxiliary heating means, and pulling a single crystal without forming a neck.

2. A method for pulling a single crystal according to claim 1, wherein the front portion of the seed crystal is previously heated using the auxiliary heating means before the seed crystal is brought into contact with the melt.

3. A method for pulling a single crystal according to claim 2, wherein the seed crystal is rotated when the front portion of the seed crystal is heated, or wherein the seed crystal is rotated when the seed crystal is dipped into the melt, or both.

4. A method for pulling a single crystal according to claim 1, wherein the seed crystal is rotated when the front portion of the seed crystal is heated, or wherein the seed crystal is rotated when the seed crystal is dipped into the melt, or both.

5. A method for pulling a single crystal according to claim 1, wherein the lower end of the auxiliary heating means is located within 30 mm above the surface of the melt.

6. A method for pulling a single crystal according to claim 1, wherein the length of the seed crystal to be dipped into the melt is two times the diameter of the seed crystal or longer.

* * * * *